United States Patent
El-Hajjar et al.

(10) Patent No.: US 9,819,528 B2
(45) Date of Patent: *Nov. 14, 2017

(54) EFFICIENT DEMAPPING OF CONSTELLATIONS

(71) Applicant: Imagination Technologies Limited, Kings Langley (GB)

(72) Inventors: Mohammed El-Hajjar, Southampton (GB); Paul Murrin, Chepstow (GB); Adrian J. Anderson, Chepstow (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/181,687

(22) Filed: Jun. 14, 2016

(65) Prior Publication Data

US 2016/0294597 A1 Oct. 6, 2016

Related U.S. Application Data

(63) Continuation of application No. 14/617,648, filed on Feb. 9, 2015, now Pat. No. 9,391,739, which is a (Continued)

(30) Foreign Application Priority Data

Jun. 7, 2012 (GB) .................... 1210079.8

(51) Int. Cl.
*H04L 27/26* (2006.01)
*H04L 25/06* (2006.01)
(Continued)

(52) U.S. Cl.
CPC ........ *H04L 27/2647* (2013.01); *H04L 1/0054* (2013.01); *H04L 25/067* (2013.01);
(Continued)

(58) Field of Classification Search
CPC ....... H04L 1/0618; H04L 1/06; H04L 1/0054; H04L 1/005; H04L 27/2647; H04B 7/0664; H03M 13/41
See application file for complete search history.

(56) References Cited

U.S. PATENT DOCUMENTS 7,245,660 B2 7/2007 Yona et al.
7,245,666 B1 7/2007 Gardner et al.
(Continued)

FOREIGN PATENT DOCUMENTS

WO 0041374 A 7/2000
WO 03007529 A 1/2003
(Continued)

*Primary Examiner* — Janice Tieu
(74) *Attorney, Agent, or Firm* — Vorys, Sater, Seymour and Pease LLP; Vincent M DeLuca

(57) ABSTRACT

Methods and apparatus for efficient demapping of constellations are described. In an embodiment, these methods may be implemented within a digital communications receiver, such as a Digital Terrestrial Television receiver. The method reduces the number of distance metric calculations which are required to calculate soft information in the demapper by locating the closest constellation point to the received symbol. This closest constellation point is identified based on a comparison of distance metrics which are calculated parallel to either the I- or Q-axis. The number of distance metric calculations may be reduced still further by identifying a local minimum constellation point for each bit in the received symbol and these constellation points are identified using a similar method to the closest constellation point. Where the system uses rotated constellations, the received symbol may be unrotated before any constellation points are identified.

18 Claims, 12 Drawing Sheets

Related U.S. Application Data continuation of application No. 13/760,361, filed on Feb. 6, 2013, now Pat. No. 8,983,009.

(51) Int. Cl.
  *H04L 27/38* (2006.01)
  *H04L 1/00* (2006.01)
  H03M 13/41 (2006.01)
  H04L 1/06 (2006.01)

(52) U.S. Cl.
  CPC .............. *H04L 27/38* (2013.01); *H03M 13/41* (2013.01); *H04L 1/06* (2013.01); *H04L 1/0618* (2013.01)

(56) References Cited

U.S. PATENT DOCUMENTS

| | | |
|---|---|---|
| 7,313,750 B1 | 12/2007 | Feng et al. |
| 7,653,153 B2 | 1/2010 | Tosato et al. |
| 2002/0067777 A1 | 6/2002 | Jeong |
| 2003/0123582 A1 | 7/2003 | Kim et al. |
| 2004/0086059 A1 | 5/2004 | Eroz et al. |
| 2005/0141628 A1 | 6/2005 | Cheng |
| 2007/0077969 A1 | 4/2007 | Lauer et al. |
| 2008/0025733 A1 | 1/2008 | Nazarathy et al. |
| 2008/0279299 A1 | 11/2008 | Reuven et al. |
| 2011/0135040 A1 | 6/2011 | Kim |

FOREIGN PATENT DOCUMENTS

| | | |
|---|---|---|
| WO | 03075528 A | 9/2003 |
| WO | 2007058424 A | 5/2007 |

EFFICIENT DEMAPPING OF CONSTELLATIONS

BACKGROUND

FIG. 1 shows a schematic diagram 100 of elements from a BICM (Bit Interleaved Coding and Modulation) module within a receiver in a digital communications system such as a Digital Terrestrial Television (DTT) system. The demapper 102 receives cells 104 and uses noise variance estimates 106 in order to output soft information 108 (which may also be referred to as soft estimates), such as Log-Likelihood Ratios (LLRs). This soft information 108 is passed to the decoder 110. In some examples, soft information is fed back to the demapper from the decoder (as indicated by dotted arrow 112) and this is referred to as iterative demapping or iterative decoding. In such an implementation, the soft information 108 output from the demapper 102 may be referred to as 'extrinsic LLRs' and the soft information which is fed back to the demapper from the decoder may be referred to as 'a priori LLRs'.

Assuming that the transmitted data symbol is x and the received symbol is z, where the bit sequence $[b_0, b_1, \ldots, b_i, \ldots, b_K]$ is mapped to symbol x and K is the number of bits mapped to the cell (which may also be referred to as a constellation symbol), the soft output 108 or LLR can be defined as:

$$L(b_i/z) = \ln \frac{p(b_i = 0/z)}{p(b_i = 1/z)} \quad (1)$$

The value of K varies depending on the constellation used, for example K=1 for BPSK (binary phase-shift keying) and K=8 for 256-QAM (quadrature amplitude modulation) constellation. The lower part of FIG. 1 shows an example 16-QAM constellation 120 for which K=4 and which shows the mapping of bit sequences to constellation points. This example uses Gray coding, such that successive sequences differ only by one bit.

In order to evaluate the LLRs, the demapper 102 typically uses a max-log approximation:

$$L(b_i/z) = \min_{x \in X_1}\left[\frac{|z-x|^2}{2\sigma^2} + \sum_{j,j\neq i} b_j L_a(b_j)\right] - \min_{x \in X_0}\left[\frac{|z-x|^2}{2\sigma^2} + \sum_{j,j\neq i} b_j L_a(b_j)\right]$$

where $X_0$ and $X_1$ are subsets of the constellation where bit $b_i=0$ and $b_i=1$, respectively. Additionally, $L_a(b_j)$ represents the a priori LLR value for bit $b_j$ that is passed from the channel decoder to the demapper, when iterative demapping is used. When no iterations are implemented, $L_a(b_j)$ is equal to zero.

In some scenarios, such as for DVB-T2, the constellation is not as shown in FIG. 1, but instead is rotated and Q-delayed. In such examples, the LLR calculation is done according to the following equation:

$$L(b_i/z) = \min_{x \in X_1}\left[\frac{|z_I-x_I|^2}{2\sigma_I^2} + \frac{|z_Q-x_Q|^2}{2\sigma_Q^2} + \sum_{j,j\neq i} b_j L_a(b_j)\right] - \quad (2)$$

-continued
$$\min_{x \in X_0}\left[\frac{|z_I-x_I|^2}{2\sigma_I^2} + \frac{|z_Q-x_Q|^2}{2\sigma_Q^2} + \sum_{j,j\neq i} b_j L_a(b_j)\right]$$

where $z_I$ and $z_Q$ are the I (in-phase) and Q (quadrature-phase) components of the received symbol z and $x_I$ and $x_Q$ are the I and Q components of the constellation point x. Additionally, $\sigma_I$ and $\sigma_Q$ are the noise standard deviation in the I- and Q-directions.

The max-log approximation is then implemented by evaluating the distance metric $$\frac{|z_I-x_I|^2}{2\sigma_I^2} + \frac{|z_Q-x_Q|^2}{2\sigma_Q^2} + \sum_{j,j\neq i} b_j L_a(b_j)$$

for all constellation points and then performing an exhaustive search to identify the minimum distance metric for each bit being '0' or '1' and performing the subtraction as in equation (2) above.

The embodiments described below are not limited to implementations which solve any or all of the disadvantages of known methods of demapping.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Methods and apparatus for efficient demapping of constellations are described. In an embodiment, these methods may be implemented within a digital communications receiver, such as a Digital Terrestrial Television receiver. The method reduces the number of distance metric calculations which are required to calculate soft information in the demapper by locating the closest constellation point to the received symbol. This closest constellation point is identified based on a comparison of distance metrics which are calculated parallel to either the I- or Q-axis. The number of distance metric calculations may be reduced still further by identifying a local minimum constellation point for each bit in the received symbol and these constellation points are identified using a similar method to the closest constellation point. Where the system uses rotated constellations, the received symbol may be unrotated before any constellation points are identified.

A first aspect provides a method of demapping received symbols in a digital communications receiver, the method comprising: receiving, at an input, a received symbol; identifying a closest constellation point to the received symbol using an iterative slicing process and based on comparisons of distance metrics running parallel to a row or column of constellation points; computing a distance metric from the received symbol to the closest constellation point; calculating soft information for each bit in the receive symbol using the computed distance metric from the received symbol to the closest constellation point; and outputting the soft information for use by a decoder within the receiver.

A second aspect provides a method of demapping received symbols in a digital communications receiver, the method comprising: receiving, at an input, a received symbol; identifying a local minimum constellation point for each bit in the received symbol using an iterative slicing process and based on comparisons of distance metrics running parallel to a row or column of constellation points; computing a distance metric from the received symbol to each local minimum constellation point; calculating soft information for each bit in the receive symbol using the computed distance metric from the received symbol to each local minimum constellation point; and outputting the soft information for use by a decoder within the receiver.

A third aspect provides a computer program comprising computer program code means adapted to perform all the steps of any of the methods described herein when said program is run on a computer. The computer program may be embodied on a computer readable medium.

A fourth aspect provides a demapper for use in a digital communications receiver, the demapper comprising: an input arranged to receive a received symbol; a decision making network arranged to identify a closest constellation point to the received symbol using an iterative slicing process and based on comparisons of distance metrics running parallel to a row or column of constellation points; a distance metric evaluator arranged to compute a distance metric from the received symbol to the closest constellation point; a soft information calculating element arranged to calculate soft information for each bit in the receive symbol using the computed distance metric from the received symbol to the closest constellation point; and an output arranged to output the soft information for use by a decoder within the receiver.

A fifth aspect provides a digital communications receiver comprising a demapper as described herein.

A sixth aspect provides a Digital Terrestrial Television receiver comprising a demapper as described herein.

Further aspects provide a method substantially as described with reference to any of FIGS. 2-10 of the drawings and an OFDM receiver substantially as described with reference to FIG. 12 of the drawings.

The methods described herein may be performed by a computer configured with software in machine readable form stored on a tangible storage medium e.g. in the form of a computer program comprising computer program code for configuring a computer to perform the constituent portions of described methods. Examples of tangible (or non-transitory) storage media include disks, thumb drives, memory cards etc and do not include propagated signals. The software can be suitable for execution on a parallel processor or a serial processor such that the method steps may be carried out in any suitable order, or simultaneously.

This acknowledges that firmware and software can be valuable, separately tradable commodities. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
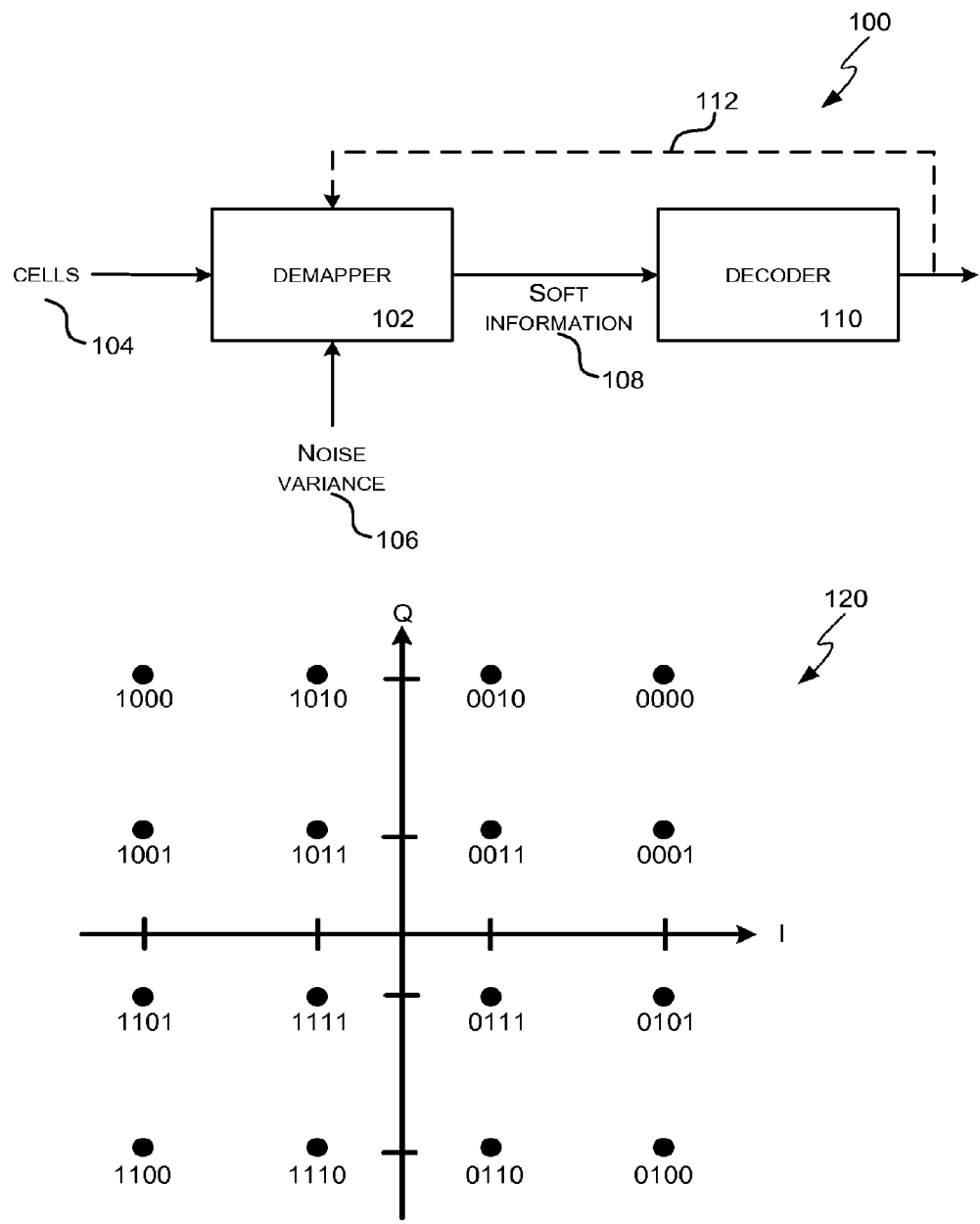
FIG. 1 is a schematic diagram showing elements from a Bit Interleaved Coding and Modulation module within a digital communications receiver.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

The term 'cell' is used herein to refer to a constellation symbol and 'cell' is used in the following description instead of constellation symbol to differentiate between constellation symbols and OFDM symbols. Any reference to 'symbol' in the following description relates to an OFDM symbol.

The term 'distance metric' is used herein to refer to a distance which although it may be a Euclidean distance is, in many examples, a scaled distance, where the Euclidean distance is scaled by the channel state information (csi) or noise variance. Where iterative demapping is used, additional terms are included within the distance metric and these are described in detail below.

The methods of evaluating LLRs described above work well for low order constellations such as BPSK (binary phase-shift keying) and QPSK (quadrature phase-shift keying). However, as the number of cells in the constellation increases, the complexity of the hardware implementation increases due to the fact that more distance metric evaluators need to be used which requires more hardware silicon area, more memory for storing the distance metrics and increased power consumption. This can be seen from the following examples:

QPSK case: equation (2) implementation requires four distance metric evaluations and 2*4 comparisons, which is feasible for implementation in software or hardware.

256-QAM case: equation (2) implementation requires 256 distance metric evaluations, sufficient memory to store these 256 results and then 8*256 comparisons to find the minimum values.

4096-QAM case: equation (2) implementation requires 4096 distance metric evaluations, sufficient memory to store these 4096 results and then 12*4096 comparisons to find the minimum values.

Implementing the max-log formula is feasible in the QPSK case but costly for the high order constellations in terms of hardware silicon area, memory required for storing the distance metric values, power consumption and throughput requirements.

Figure 2:
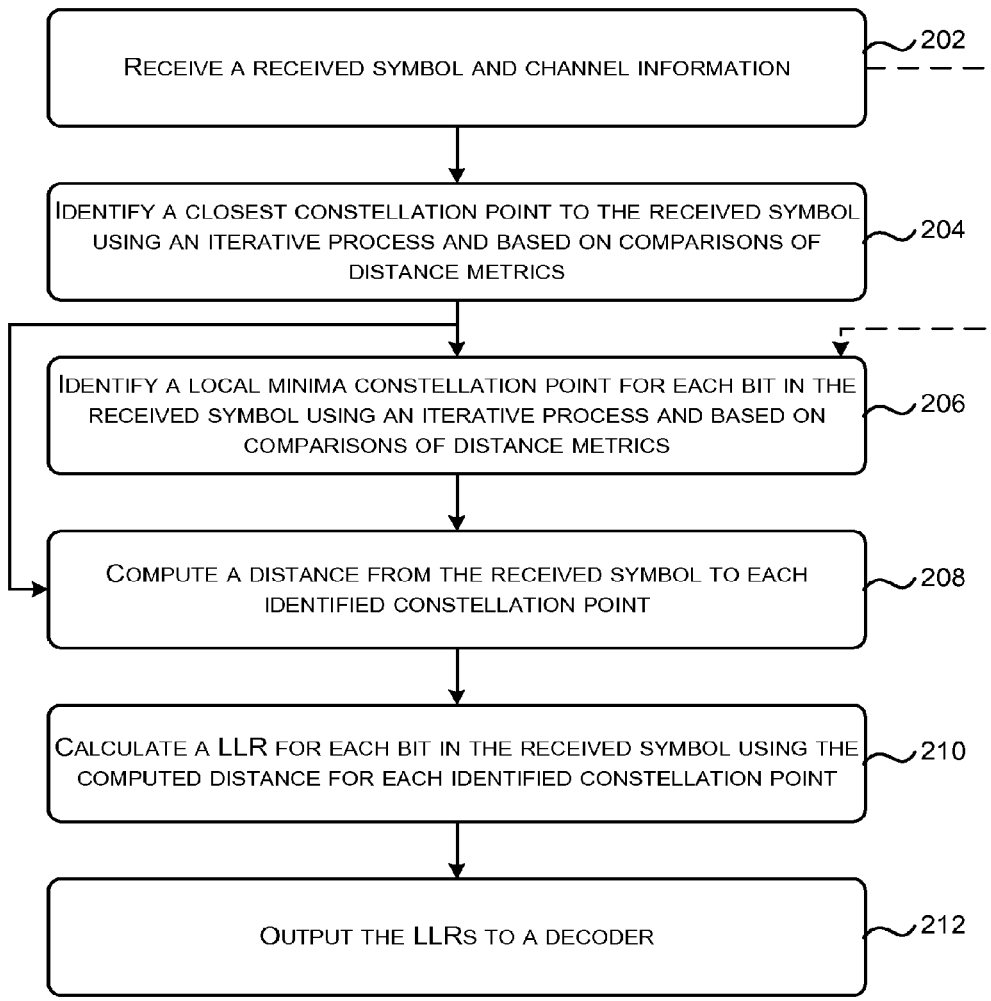
FIG. 2 shows a flow diagram of an example method of operation of a demapper in a receiver.

The following description describes a Decision Making Network (DMN) within the demapper in a digital communications receiver which, as shown in the example flow diagram in FIG. 2, finds the closest constellation point (block 204) and then calculates the minimum distance metric for all the bits (block 208), such that the LLRs can be evaluated (in block 210), while requiring significantly fewer distance metric evaluations than are required using the max-log approximation described above. For example, this first stage of the method, which finds the closest constellation point (block 204), halves the number of distance metric evaluations that are required (as performed in block 208).

Furthermore, as described in more detail below, this closest constellation point may be found without calculating any distance metrics. To further reduce the number of distance metric evaluations, this first stage may be combined with a second stage which comprises identifying local minima constellation points for each bit in the received symbol (block 206), such that for 256-QAM only 9 distance metrics are evaluated (in block 208), compared to 256 distance metric evaluations using the conventional max-log implementation described above. Again, in the second stage, the local minima constellation points for each bit in the received symbol may be found without calculating any distance metrics.

Although the following description describes both the first and second stages, the first stage may be used independently without performing the second stage (e.g. omitting block 206 from the flow diagram in FIG. 2 as indicated by the arrow from block 204 to block 208) or alternatively, the second stage may be used independently without first performing the first stage (e.g. omitting block 204 from the flow diagram in FIG. 2 as indicated by the dotted arrow from block 202 to block 206).

The inputs to the DMN, and hence to the method of operation of the DMN shown in FIG. 2 (as received in block 202), are a received symbol and channel information (e.g. channel state information or noise information). In some examples, however, the channel information may not be received (and hence only a received symbol would be received in block 202) but instead the channel information may be estimated or inferred. The calculated LLRs (or other soft information which may be generated from the LLRs) are output by the demapper to a decoder within the receiver (block 212).

As is described in more detail below, both the first and second stages (blocks 204 and 206) involve an iterative process based on comparisons of distance metrics (e.g. based on the sign of a difference between distance metrics) to find global minimum or local minima constellation points.

This iterative process may be referred to as 'slicing' as in each step, the search space of the row/column within the constellation is divided in half, until a single point is identified.

As will be appreciated from the following description, where the first stage is implemented without the second stage (i.e. block 206 is omitted, as indicated by the arrow from block 204 to block 208), additional distance metric calculations will be required to calculate the LLRs since the local minima have not been identified (these additional calculations may be performed in block 208 or 210). Similarly, where the second stage is implemented without the first stage (i.e. block 204 is omitted, as indicated by the dotted arrow from block 202 to block 206), two local minima constellation points would be identified for each bit in the received symbol (one for bit code=1 and one for bit code=0) and so additional distance metric calculations would be required to calculate the LLRs.

By using the DMN and methods described herein, it is possible to demap each received cell in one cycle and also possible to support iterative demapping. The methods also require reduced hardware silicon area, have a reduced memory storage requirement and have a reduced power consumption.

The methods described below are applicable to iterative demapping and also to examples where there is no iteration (i.e. where there is no feedback of soft information from the decoder to the demapper). The methods are also applicable to both non-rotated and rotated constellations and to any Gray code mapping with reflective symmetries in the I/Q axes. The method will initially be described for a non-rotated constellation and non-iterative demapping and then more complex examples will be described. In the following description, a particular Gray code mapping is used, which may be referred to as the 'internal Gray code mapping'; however, as described below with reference to FIGS. 10 and 11, constellations with other Gray code mappings may first be transformed so that they correspond to the internal Gray code mapping.

Figure 3:
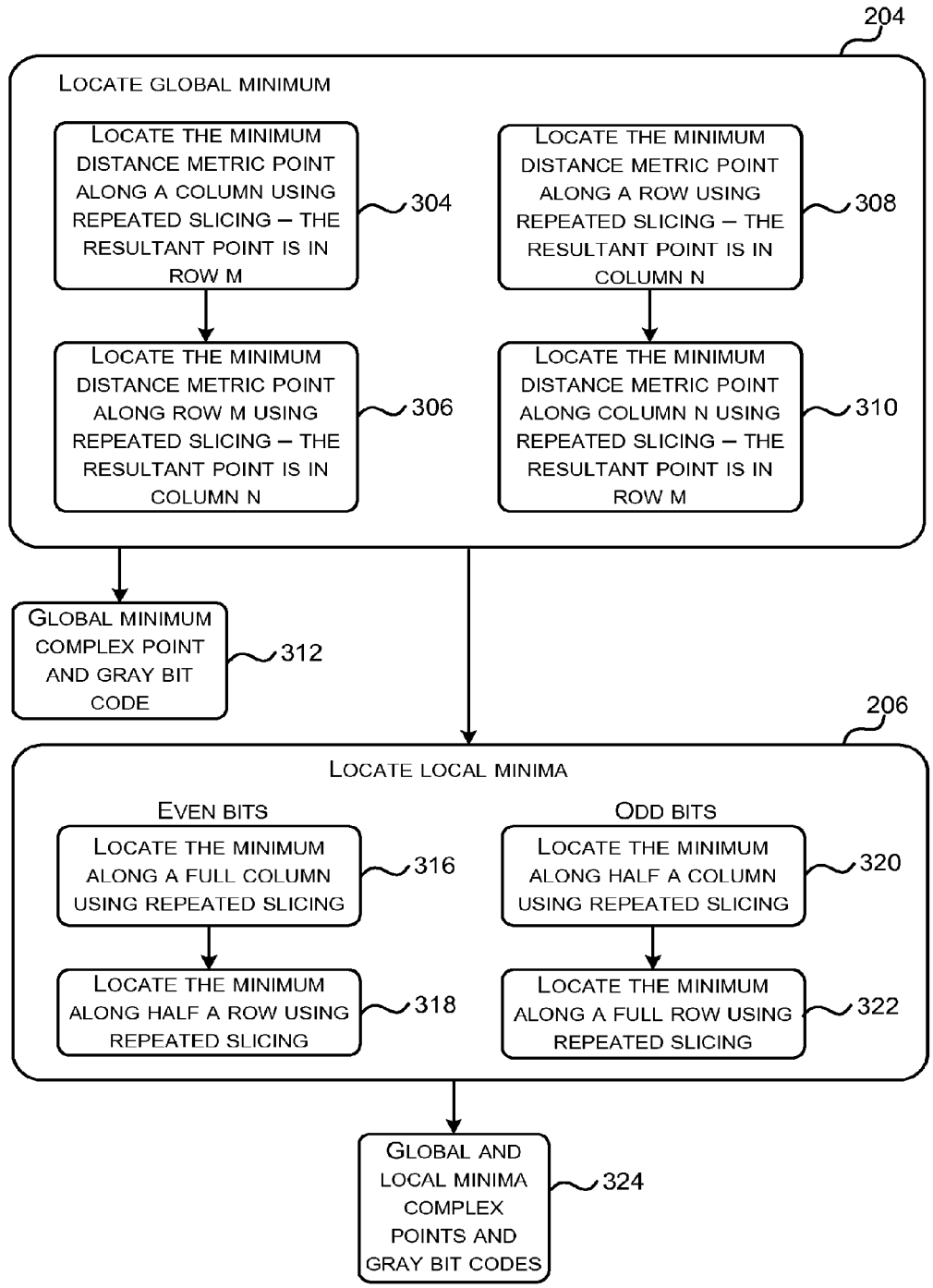
FIG. 3 shows a flow diagram of an example method of operation of a Decision Making Network within a demapper.

FIG. 3 shows a flow diagram of an example method of operation of a Decision Making Network which may be implemented within a demapper of a digital communications receiver (e.g. an OFDM receiver). This method may be described with reference to FIG. 4 which shows two example constellations: the first constellation 401 is 64-QAM and the second constellation 402 is 256-QAM.

The first stage of the method comprises locating the global minimum (block 204). The global minimum is the closest constellation point to the received cell and therefore the distance metric between the received cell and the global minimum is the minimum distance metric for each bit. For example, it can be seen in FIG. 4, that the received cell 404 marked by a cross is closest to constellation point having the bit mapping 001011 (which, for brevity, may be referred to as the constellation point 001011) and so the global minimum distance metric, D, for this cell (and for each of the six bits mapped to the cell) is the distance metric between that constellation point 001011 and the cell 404. The global minimum is located using a two step process and two variants of this process are shown in FIG. 3. Each step (in either variant) comprises an iterative process of slicing in which the search space for the closest constellation point is halved and the number of iterations (or slicing operations) which are used will depend on the particular constellation being used. In the case of 256-QAM there are four slicing operations in each step, whilst in 64-QAM there are only three. In general, the number of slicing operations which are required is given by K/2 (where K is the number of bits which are mapped to a cell, as defined earlier).

In order to locate a global minimum (in block 204), given a received cell, the minimum distance metric point (i.e. the point with the smallest distance metric parallel to one axis) is first located along either a column (as in block 304) or a row (as in block 308) by performing the slicing (as described in more detail below) and then having located that first minimum distance metric point which identifies a row (row M) or column (column N) respectively, the minimum distance metric point is then located along the other axis, i.e. where a row has been identified (in block 304), a minimum point along that row is located to identify a column (in block 306) and where a column has been identified (in block 308), a minimum point along that column is located to identify a row (in block 310). The resultant situation is the same for both variants as both a row M and column N are identified which uniquely identifies a closest constellation point (e.g. by row and column indices and in the example of FIG. 4 would be $R_1$ and $C_2$). In the case of a non-rotated constellation, the method can be performed by either variant and both variants give the same result. Where the constellation is rotated, the appropriate order (row then column or column then row) is selected to search for the global minimum and this is described in more detail below.

Figure 4:
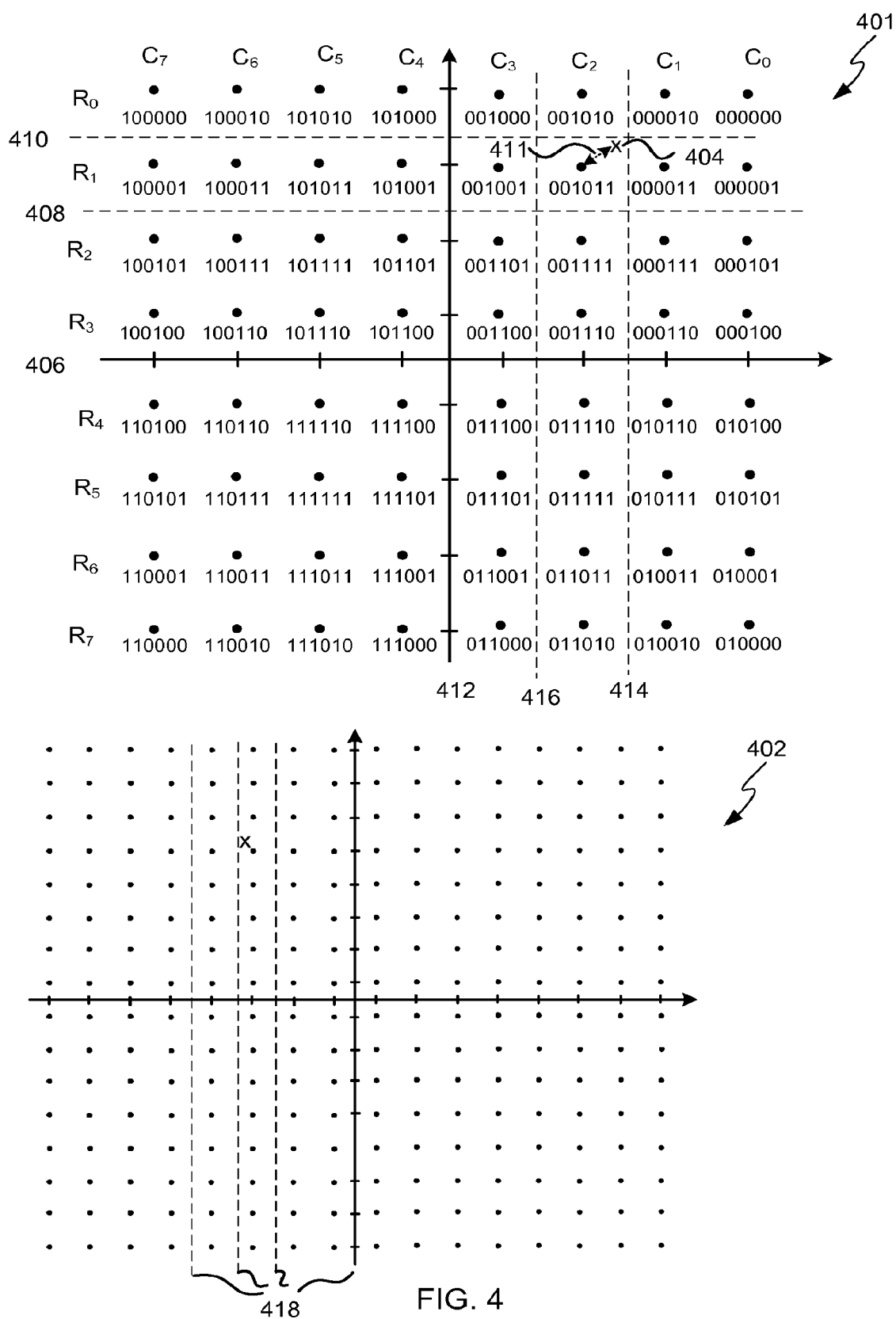
FIG. 4 shows two example constellation diagrams: 64-QAM and 256-QAM.
Figure 5:
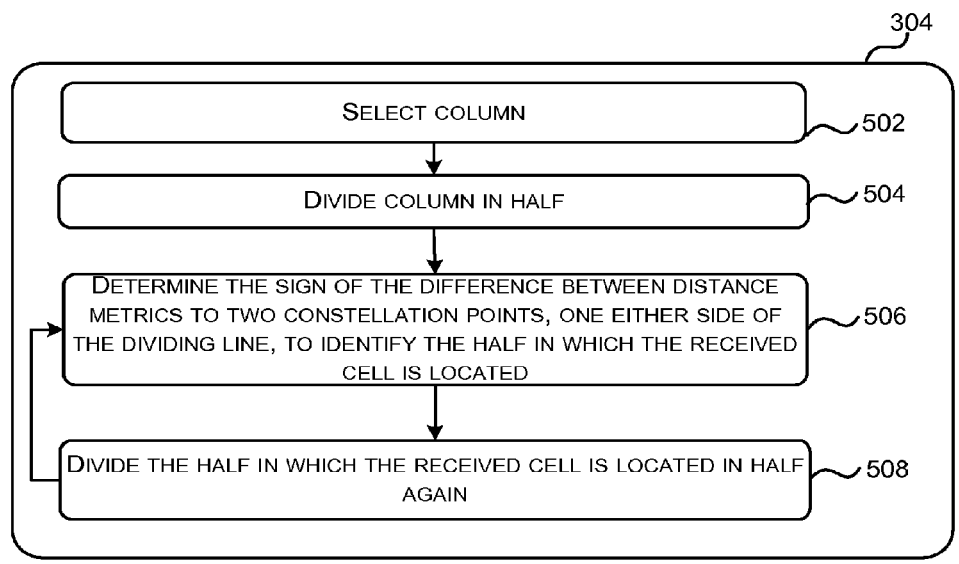
FIG. 5 shows an example flow diagram of the method of finding the minimum distance metric point along a column and also shows a portion of one of the constellation diagrams from FIG. 4.
Figure 5:
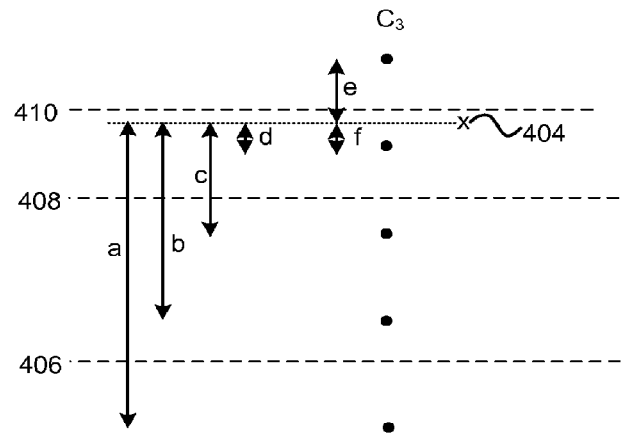

FIG. 5 shows an example flow diagram of a method of finding the minimum distance metric point along a column (block 304 from FIG. 3). As shown in FIG. 5, a column is first selected (block 502) and using the 64-QAM example constellation 401 in FIG. 4, column $C_3$ may, for example, be selected. This column of the constellation is also reproduced in the lower half of FIG. 5. This selection step (in block 502) may select any column, because, as described below, the comparison steps only consider distance metrics which are computed parallel to the Q-axis (and hence the column).

To perform the first slicing operation, the column is divided in half (block 504), i.e. along the horizontal line 406 shown in FIGS. 4 and 5 (this is in fact the I-axis in this example). To determine which half the received cell 404 is located in (e.g. above or below line 406), a comparison of distance metrics is performed (block 506). In this particular example, the comparison is performed by determining the sign of a difference between distance metrics between the received cell and two constellation points, one either side of the dividing line 406 (in block 506). Referring to FIG. 5, these two distance metrics are labeled a and b, and so the sign of the difference between distance metrics is sign(a−b) (or sign(b−a)). As shown in FIG. 5, these distance metrics which are used to find the minimum distance metric point are computed in a single dimension only which runs parallel to the Q-axis (and to the column of the constellation) and any distances (or distance metrics) in the perpendicular direction are ignored for the purposes of this computation. In other words, when performing slicing to identify a row (in block 304), the imaginary part of the received cell is used in computing the sign of a difference between distance metrics. In the example shown in FIGS. 4 and 5, the sign of a-b is positive (a>b) and so the received cell is located in the upper half of the constellation. As is described in more detail below, the sign of the difference between distance metrics may be calculated without evaluating the distance metrics themselves (e.g. as shown in equations 5a, 5b, 6a, 6b) and can therefore be implemented in a hardware efficient way.

To perform the second slicing operation, the upper half of the column (i.e. the half of the column in which the received cell 404 is located, as determined in the previous slicing operation) is divided in half again (block 508), e.g. as shown by the horizontal dotted line 408 in FIGS. 4 and 5. The sign of the difference between distance metrics between the received cell 404 and a constellation point either side of the dividing line 408 is then determined (in block 506) e.g. sign(c−d) as shown in FIG. 5, and in the example shown the difference between distance metric is positive (c>d) so the received cell 404 is again located in the upper half of the search space (i.e. the upper half of the upper half of the column). The method is then repeated (block 508 followed by block 506) until the row in which the received cell is located is identified. In the example shown in FIGS. 4 and 5, the third slicing operation divides the column along dotted line 410 and then again the sign of the difference between distance metrics is calculated (e.g. sign(e−f)) and in this example, this third slicing operation identifies that the received cell 404 is in row $R_1$ (row index=1).

Having located the row (row M, in block 304), a very similar method is used to locate the minimum distance metric point along row M using repeated slicing (block 306). This can again be described with reference to the 64-QAM constellation diagram 401 in FIG. 4. In the first slicing operation, the row ($R_1$) is divided in half (i.e. along the Q-axis 412) and the comparison of distance metrics is performed. As in the example described above, this comparison may involve determining the sign of the difference between distance metrics between the received cell and constellation points either side of the dividing line 412. As described above, this calculation of the sign of the difference between distance metrics is performed in a single dimension only and in this part of the method that single dimension runs parallel to the I-axis (and parallel to a row) and uses the real part of the received cell. In the example shown in FIG. 4, this first slicing operation determines that the received cell 404 is to the right of the dividing line 412 (i.e. in one of columns $C_0$-$C_3$). The method is then repeated by slicing the remaining half of the constellation/row along line 414 and using the sign of the difference between distance metrics to determine that the received cell 404 is located in one of columns $C_2$ and $C_3$. The third (and final) slicing operation is along line 416 and the comparison operation involves comparing the distance metrics to constellation points 001001 and 001011 in a single dimension (e.g. by determining the sign of the difference between distance metrics). This final operation identifies that the received point is in column $C_2$.

The first stage of the method (block 204) therefore identifies the closest constellation point (in complex form) and the Gray code associated with that constellation point (which may be output in block 312 of FIG. 3) and the method may stop at this point or continue to perform the second stage (described below). In the example shown in FIG. 4, the Gray code of the closest constellation point is 001011. The global minimum distance metric D, i.e. the distance metric to the closest constellation point, is therefore the distance metric between the received cell and this identified constellation point (where this is not calculated in a single dimension parallel to an axis, but is instead calculated in a straight line between the points, as indicated by the dotted double-ended arrow 411 in FIG. 4) and can be computed (for non-iterative demapping) using:

$$D = \frac{|z_I - x_I|^2}{2\sigma^2} + \frac{|z_Q - x_Q|^2}{2\sigma^2}$$

where $z_I$ and $z_Q$ are the I and Q components of the received symbol z and $x_I$ and $x_Q$ are the I and Q components of the constellation point x. Additionally, σ is the noise standard deviation (which is the same for both the I- and Q-directions for non-rotated constellations). Where iterative demapping is used, there is an additional term in the distance metric calculation (which relates to the a priori LLR value for the bit) and this is described in more detail below.

As described above, by computing this global minimum distance metric, D, the number of distance metric computations that are required in order to compute the LLRs are halved. Equation (2) above is used to calculate the LLRs and this may be written as:

$$L(b_i/z) = d_1^i - d_0^i$$

where i is the index of the bit in the constellation point bit sequence, $$d_1^i = \min_{x \in X_1} \left[ \frac{|z_I - x_I|^2}{2\sigma^2} + \frac{|z_Q - x_Q|^2}{2\sigma^2} \right] \quad (3)$$

and $$d_0^i = \min_{x \in X_0} \left[ \frac{|z_I - x_I|^2}{2\sigma^2} + \frac{|z_Q - x_Q|^2}{2\sigma^2} \right] \quad (4)$$

for the non-rotated, non-iterative case ($L_a(b_1)$ in equation (2) above is equal to zero). Using the information obtained from the first stage of the method shown in FIG. 3:

$$L(b_0/z) = d_1^0 - D$$

$$L(b_1/z) = d_1^1 - D$$

$$L(b_2/z) = D - d_0^2$$

$$L(b_3/z) = d_1^3 - D$$

$$L(b_4/z) = D - d_0^4$$

$$L(b_5/z) = D - d_0^5$$

since the minimum distance metric to a constellation point with $b_0=0$ ($d_0^0$) must be D as this is the distance metric to the closest constellation point and this constellation point has the Gray code 001011 (where this is written in the format $b_0 b_1 b_2 b_3 b_4 b_5$), etc.

To further reduce the number of distance metric calculations which are required in order to compute the LLRs (in the demapper), the second stage of the method (block 206) may be performed. This second stage (block 206) locates local minima, i.e. for each bit in the sequence, the method locates the closest constellation point with the opposite bit value to the global minimum. For example, where the global minimum has the Gray code 001011 (as in the example shown in FIG. 4), the second stage identifies the closest constellation point with $b_0=1$ (as the global minimum has $b_0=0$), the closest constellation point with $b_1=1$, the closest constellation point with $b_2=0$, the closest constellation point with $b_3=1$, the closest constellation point with $b_4=0$ and the closest constellation point with $b_5=0$. These six closest constellation points are the local minima for this example.

Figure 6:
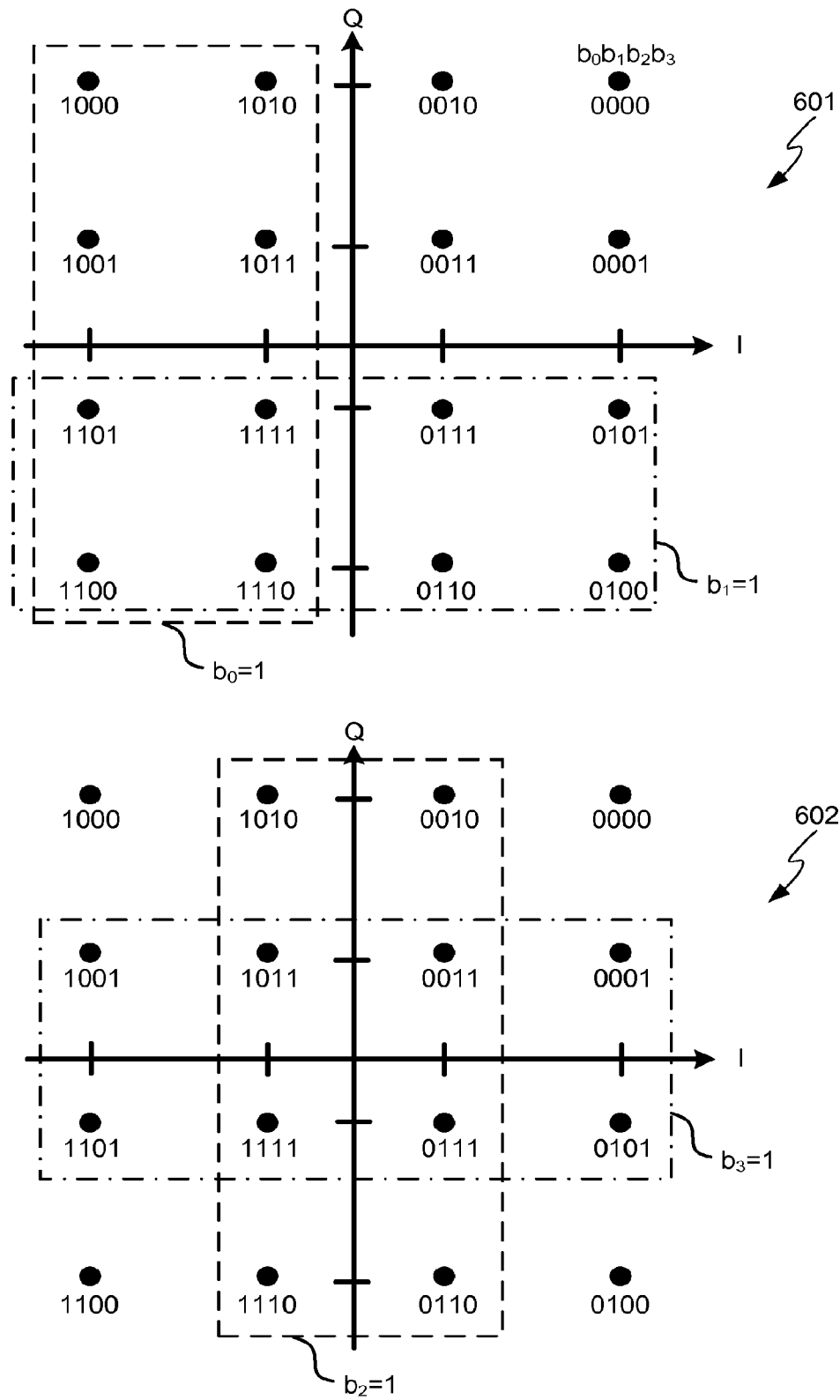
FIG. 6 shows example 16-QAM constellation diagrams.

This second stage uses a similar technique of repeated slicing to the first stage (as described above); however, as the search for each local minimum distance metric point (one for each bit) is for a constellation point with a particular value of Gray bit code (e.g. 0 or 1), the search space is already halved, as is shown in FIG. 6 for a 16-QAM constellation (for purposes of clarity, the same constellation is shown twice, with the first constellation 601 showing the search space for bits Nand $b_1$ and the second constellation 602 showing the search space for bits $b_2$ and $b_3$). For example, for an even bit ($b_0$, $b_2$) looking for a local minimum distance metric value to a constellation point with a Gray bit code=1, the search space is limited to a full column (as explored in block 316) and half a row (as explored in block 318). Similarly, for an odd bit ($b_1$, $b_3$) looking for a local minimum distance metric value to a constellation point with a Gray bit code=1, the search space is limited to half a column (as explored in block 320) and a full row (as explored in block 322). It will be appreciated that although FIG. 6 shows the search spaces for constellation points with a Gray bit code=1 outlined with dotted/dashed lines, the search spaces for constellation points with a Gray bit code=0 is the portion of the constellation outside the dotted/dashed lines.

The output of the second stage is therefore a closest constellation point for each bit with the required value of Gray bit code (i.e. a value which is opposite to that in the global minimum constellation point identified in the first stage) and the Gray bit code for each local minimum constellation point, as well as the global minimum data output by the first stage (block 324). Referring back to the example shown in constellation 401 in FIG. 4, the output from the second stage is therefore the global minimum constellation point and Gray bit code 001011 and data about six local minima constellation points. In the example shown in FIG. 4, these six local minimum constellation points are:

$b_0=1$ 1̲01001

$b_1=1$ 01̲1110

$b_2=0$ 000̲011

$b_3=1$ 0011̲11

$b_4=0$ 00100̲1

$b_5=0$ 001010̲

These six local minima constellation points are used to calculate the six distance metrics ($d_1^i$ or $d_0^i$) required in the following expressions to calculate the LLRs:

$$L(b_0/z) = d_1^0 - D$$

$$L(b_1/z) = d_1^1 - D$$

$$L(b_2/z) = D - d_0^2$$

$$L(b_3/z) = d_1^3 - D$$

$$L(b_4/z) = D - d_0^4$$

$$L(b_5/z) = D - d_0^5$$

It can therefore be seen that in this example, by using the methods described above, the number of distance metrics that need to be calculated is halved by the first stage and then reduced to only seven distance metrics (instead of 64) using the second stage as well. For larger constellations, such as the 256-QAM example 402 shown in FIG. 4, the savings are greater, but a slightly larger number of slicing operations are required (the dotted lines 418 in FIG. 4 show how a row is divided when performing slicing of 256-QAM and it can be seen that four slicing operations are required).

The above methods describe the situation for non-rotated, non-iterative demapping. Where iterative demapping is used, $L_a(b_j)$ is non-zero, such that equations (3) and (4) above become:

$$d_1^i = \min_{x \in X_1} \left[ \frac{|z_I - x_I|^2}{2\sigma^2} + \frac{|z_Q - x_Q|^2}{2\sigma^2} + \sum_{j, j \neq i} b_j L_a(b_j) \right] \quad (3a)$$

and $$d_0^i = \min_{x \in X_0} \left[ \frac{|z_I - x_I|^2}{2\sigma^2} + \frac{|z_Q - x_Q|^2}{2\sigma^2} + \sum_{j, j \neq i} b_j L_a(b_j) \right] \quad (4a)$$

In cases where the constellations are rotated and Q-delayed (e.g. for DVB-T2), the real and imaginary parts are transmitted on different sub-carriers or different time instances which means that the noise standard deviations in the I- and Q-directions may not be the same (as was assumed in the equations above). In such situations, the noise standard deviations in the I- and Q-directions are given by $\sigma_I$ and $\sigma_Q$. Where iterative demapping is not used, this leads to equations (3) and (4) becoming:

$$d_1^i = \min_{x \in X_1} \left[ \frac{|z_I - x_I|^2}{2\sigma_I^2} + \frac{|z_Q - x_Q|^2}{2\sigma_Q^2} \right] \quad (3b)$$

and $$d_0^i = \min_{x \in X_0} \left[ \frac{|z_I - x_I|^2}{2\sigma_I^2} + \frac{|z_Q - x_Q|^2}{2\sigma_Q^2} \right] \quad (4b)$$

Alternatively, where iterative demapping is used equations (3) and (4) become:

$$d_1^i = \min_{x \in X_1} \left[ \frac{|z_I - x_I|^2}{2\sigma_I^2} + \frac{|z_Q - x_Q|^2}{2\sigma_Q^2} + \sum_{j, j \neq i} b_j L_a(b_j) \right] \quad (3c)$$

and $$d_0^i = \min_{x \in X_0} \left[ \frac{|z_I - x_I|^2}{2\sigma_I^2} + \frac{|z_Q - x_Q|^2}{2\sigma_Q^2} + \sum_{j, j \neq i} b_j L_a(b_j) \right] \quad (4c)$$

Figure 7:
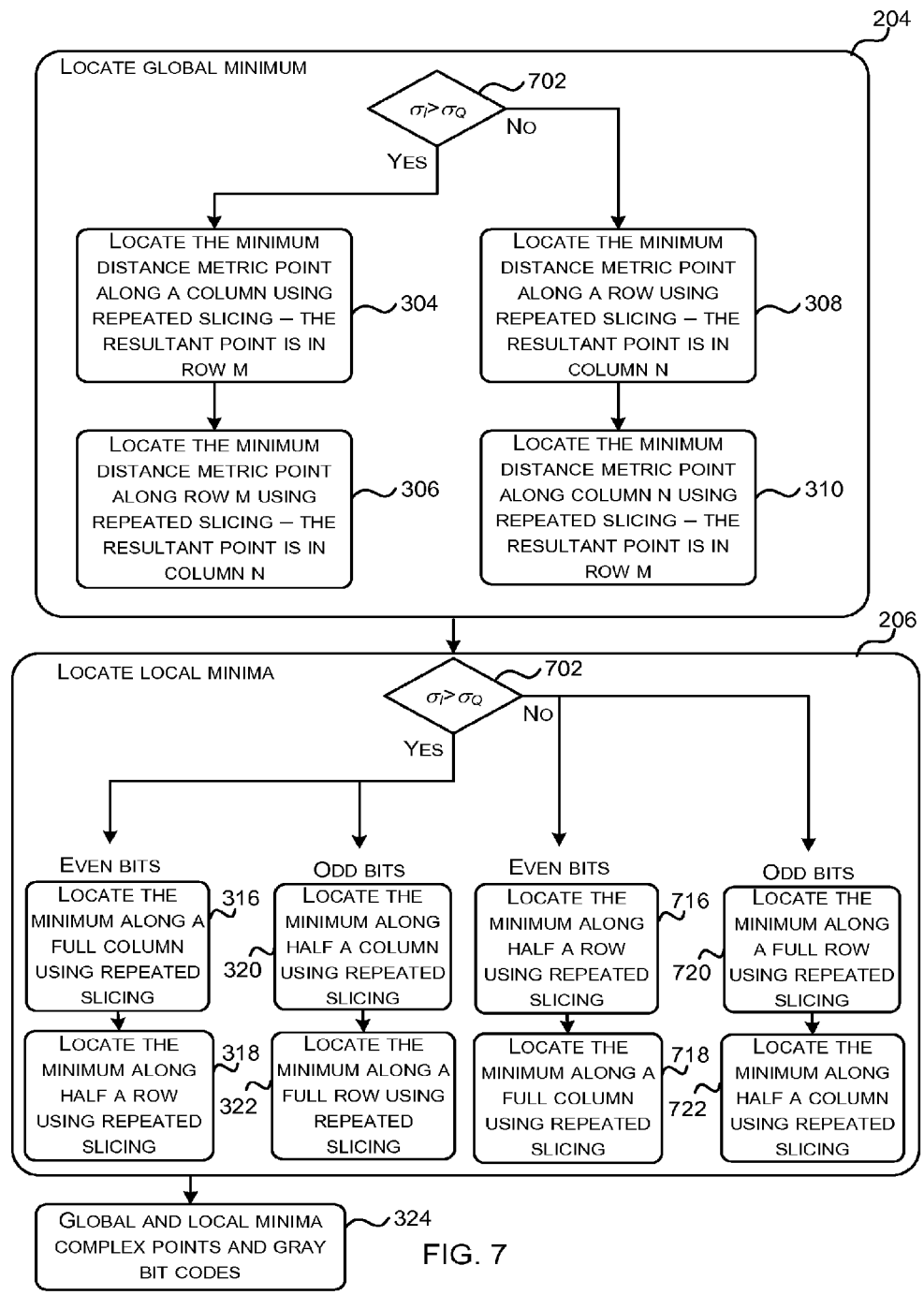
FIG. 7 shows a flow diagram of another example method of operation of a demapper in a receiver.

In rotated constellations, the methods described above are applied with a few changes. The modified equations (3b and 4b, or 3c and 4c) which involve $\sigma_I$ and $\sigma_Q$ are used in calculating distance metrics and a decision is also made as to whether to find the column or row first. This is shown in FIG. 7 and the decision point (in block 702) based on a comparison of the csi or noise standard deviations, has the effect that the search is initially performed along the uncompressed axis. If instead, this decision step (block 702) was omitted, there may be some errors in selecting the closest constellation point, but the method could still be used. As is shown in FIG. 7, this decision point affects both the order in which the constellation is searched for the global minimum (in block 204) and the order in which the search is performed for the local minima (in blocks 716-722 within block 206).

When calculating the sign of the difference between distance metrics (e.g. in block 304, 506, 306, 308 or 310) for rotated constellations, the received cell is un-rotated and then the imaginary or the real parts of the un-rotated cell are used to locate the row or column where the received cell is located using the methods described above. This has the effect that the difference between distance metrics is evaluated parallel to either the I-axis or Q-axis in the same way as for non-rotated constellations (and as described above).

Depending on the particular circumstances, one of the following four equations may be used for rotated and Q-delayed constellations to calculate the sign of the difference between distance metrics between the received cell and the minima in each half of the row/column and these equations may be used both for finding the global minima (in the first stage) and for finding the local minima (in the optional second stage):

a) When $\sigma_I \geq \sigma_Q$ or $csi_I \leq csi_Q$ and comparing along a row, the sign of the difference between distance metrics becomes:

$$\text{sign}\left[ ((x_{I,A} + x_{I,B})/2 - z_I) \cdot \frac{\sigma_Q^2}{\sigma_I^2} + \tan(\theta) \cdot ((x_{Q,A} + x_{Q,B})/2 - z_Q) + \frac{L_a(b_k) \cdot \sigma_Q^2}{x_{I,A} - x_{I,B}} \right] \quad (5)$$

b) When $\sigma_I \geq \sigma_Q$ or $csi_I \leq csi_Q$ and comparing along a column, the sign of the difference between distance metrics becomes:

$$\text{sign}\left[ -\tan(\theta) \cdot ((x_{I,A} + x_{I,B})/2 - z_I) \cdot \frac{\sigma_Q^2}{\sigma_I^2} + ((x_{Q,A} + x_{Q,B})/2 - z_Q) + \frac{L_a(b_k) \cdot \sigma_Q^2}{x_{Q,A} - x_{Q,B}} \right] \quad (6)$$

c) When $\sigma_I \leq \sigma_Q$ or $csi_I \geq csi_Q$ and comparing along a row, the sign of the difference between distance metrics becomes:

$$\text{sign}\left[ ((x_{I,A} + x_{I,B})/2 - z_I) + \tan(\theta) \cdot ((x_{Q,A} + x_{Q,B})/2 - z_Q) \cdot \frac{\sigma_I^2}{\sigma_Q^2} + \frac{L_a(b_k) \cdot \sigma_I^2}{x_{I,A} - x_{I,B}} \right] \quad (7)$$

d) When $\sigma_I \leq \sigma_Q$ or $csi_I \geq csi_Q$ and comparing along a column, the sign of the difference between distance metrics becomes:

$$\text{sign}\left[ -\tan(\theta) \cdot ((x_{I,A} + x_{I,B})/2 - z_I) + ((x_{Q,A} + x_{Q,B})/2 - z_Q) \cdot \frac{\sigma_I^2}{\sigma_Q^2} + \frac{L_a(b_k) \cdot \sigma_I^2}{x_{Q,A} - x_{Q,B}} \right] \quad (8)$$

where $x_{I,A}$ and $x_{I,B}$ are the real parts of the constellation points either side of the dividing line and $x_{Q,A}$ and $x_{Q,B}$ are the imaginary parts.

It will be appreciated that these equations may also be used in the non-rotated case, but in such instances $\sigma_I$ and $\sigma_Q$ are the same ($\sigma_I = \sigma_Q = \sigma$) and $\theta = 0$ so that equations (5)-(8) are simplified to:

e) When comparing along a row, the sign of the difference between distance metrics becomes:

$$\text{sign}\left[ ((x_{I,A} + x_{I,B})/2 - z_I) + \frac{L_a(b_k) \cdot \sigma^2}{x_{I,A} - x_{I,B}} \right] \quad (5a)$$

f) When comparing along a column, the sign of the difference between distance metrics becomes:

$$\text{sign}\left[((x_{Q,A}+x_{Q,B})/2-z_Q)+\frac{L_a(b_k)\cdot\sigma^2}{x_{Q,A}-x_{Q,B}}\right] \quad (6a)$$

Or where iterative demapping is not used:
g) When comparing along a row, the sign of the difference between distance metrics becomes:

$$\text{sign}\lfloor((x_{I,A}+x_{I,B})/2-z_I)\rfloor \quad (5b)$$

h) When comparing along a column, the sign of the difference between distance metrics becomes:

$$\text{sign}\lfloor((x_{Q,A}+x_{Q,B})/2-z_Q)\rfloor \quad (6b)$$

where $z_I$ and $z_Q$ are the I (in-phase) and Q (quadrature-phase) components of the received symbol z, $x_{I,A}$ and $x_{I,B}$ are the real parts of the constellation points either side of the dividing line and $x_{Q,A}$ and $x_{Q,B}$ are the imaginary parts of the constellation points either side of the dividing line.

A particular example implementation of the DMN for rotated and Q-delayed constellations and where iterative demapping may be used is described in more detail below with reference to FIGS. 8 and 9. As before, where iterative demapping is not used, the values of $L_a(b_j)$ are equal to zero and so the methods and hardware described below may also be used with an additional step which sets the La values 932 to a default value.

Figure 8:
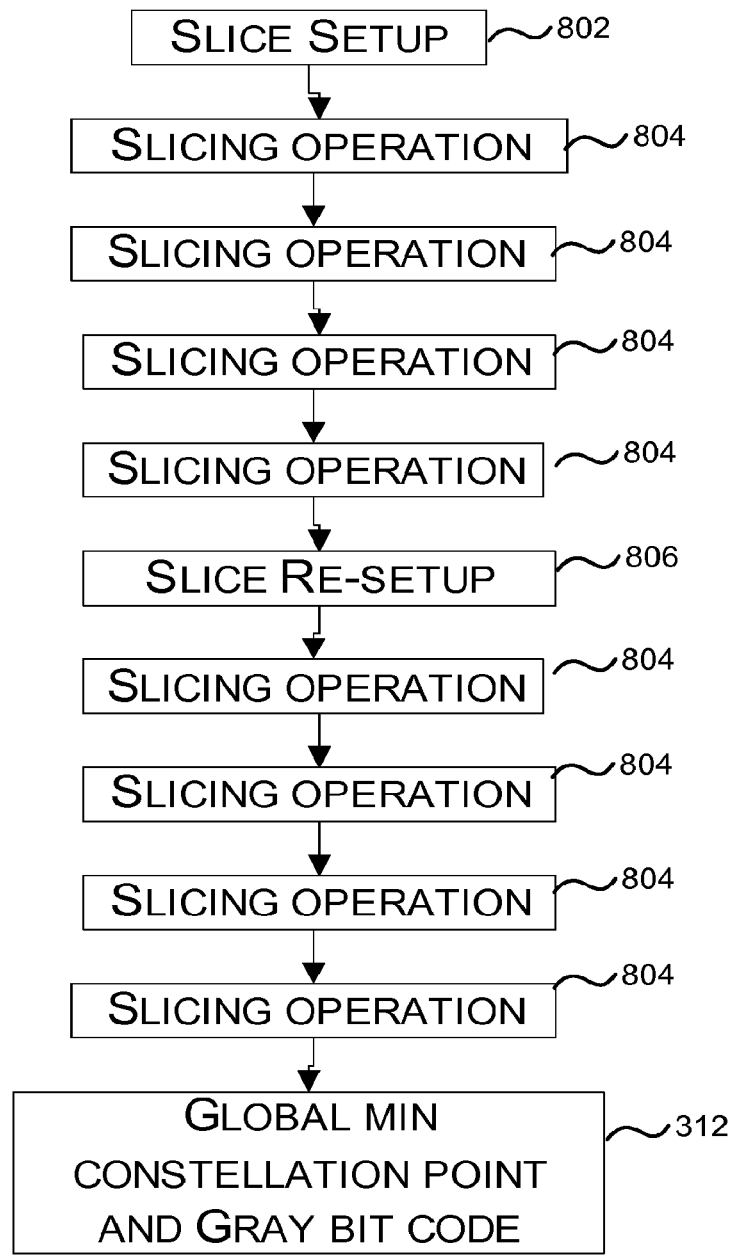
FIG. 8 shows a flow diagram of an example method of locating a global minimum.
Figure 9:
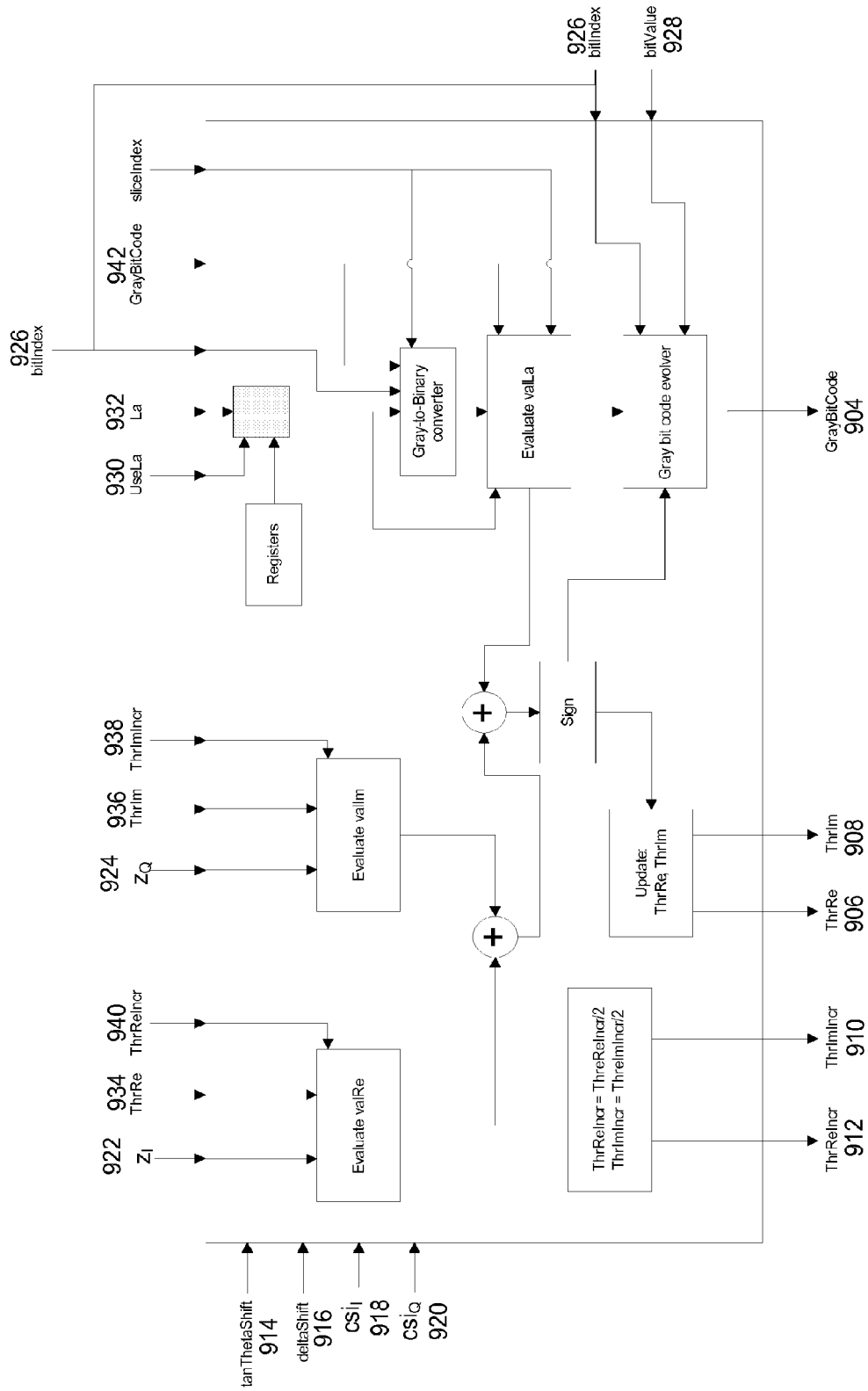
FIG. 9 shows a schematic diagram of an example slice design.

An example implementation of the method of locating the global minima (i.e. the first stage of the method described above, as in block 204 of FIG. 3) is shown in the example flow diagram in FIG. 8. This method involves a slice set-up operation (block 802 in FIG. 8) before multiple slicing operations (block 804) and then, (when switching between rows and columns) a slice re-setup operation (block 806). The term 'slice' is used herein to refer to an instance of hardware (i.e. hardware logic) that performs the slicing operation and a schematic diagram of a slice is shown in FIG. 9. As described above, the output of the method is the global minimum constellation point and Gray bit code of that point (block 312).

The slicing operation (block 804) can be described with reference to FIG. 9 which shows the slice design where the slice main function is to evaluate the sign of the difference between distance metrics using equations (5)-(8) and outputting the Gray bit Code 904 and a number of parameters 906-912 which are used in the next slicing operation (e.g. as input values 934-940). In one hardware implementation, there may be a single instance of slice hardware, in which case data is fed back to the same slice hardware. Alternatively, there may be more than one instance of slice hardware, in which case data may be passed from one instance of slice hardware to another instance of slice hardware (although even in this implementation, there may be fewer instances of slice hardware than slicing operations and so data may be fed back into the same instance of slice hardware in some situations).

In order to locate the global minimum, after the slice setup (block 802) as shown in FIG. 8, the slice input is constituted of a number of fixed parameters 914-932 and a number of evolving parameters 934-942. The fixed parameters include $\text{csi}_I$ 918, $\text{csi}_Q$ 920, $z_I$ 922, $z_Q$ 924 and a number of other parameters relating to the spacing between constellation points (deltaShift 916) and the use of iterative demapping (use La 930 and La 932). The evolving parameters include the Gray bit code 942 and terms which are used in equations (5)-(8) such as ThrRe 934 and ThrIm 936 which are defined as:

$$\text{thr } Re=(x_{I,A}+x_{I,B})/2$$

$$\text{thr } Im=(x_{Q,A}+X_{Q,B})/2$$

and which may be evaluated by the demapper during the setup process (block 802). The Gray bit code 942 may be initialized to all zeros during this setup process.

The above example describes a method of identifying the global minimum. As shown in FIGS. 2 and 3 and described above, the demapper may then identify local minima which correspond to the minimum metric points for each bit code where the value of the bit code for the local minima is opposite to that for the global minimum. This is referred to as the second stage and although this second stage is optional, it further reduces the number of distance metric calculations that need to be performed in order to calculate the LLRs. This second stage may also be implemented using the slice hardware shown in FIG. 9 and this may involve changing some of the parameters used.

Figure 10:
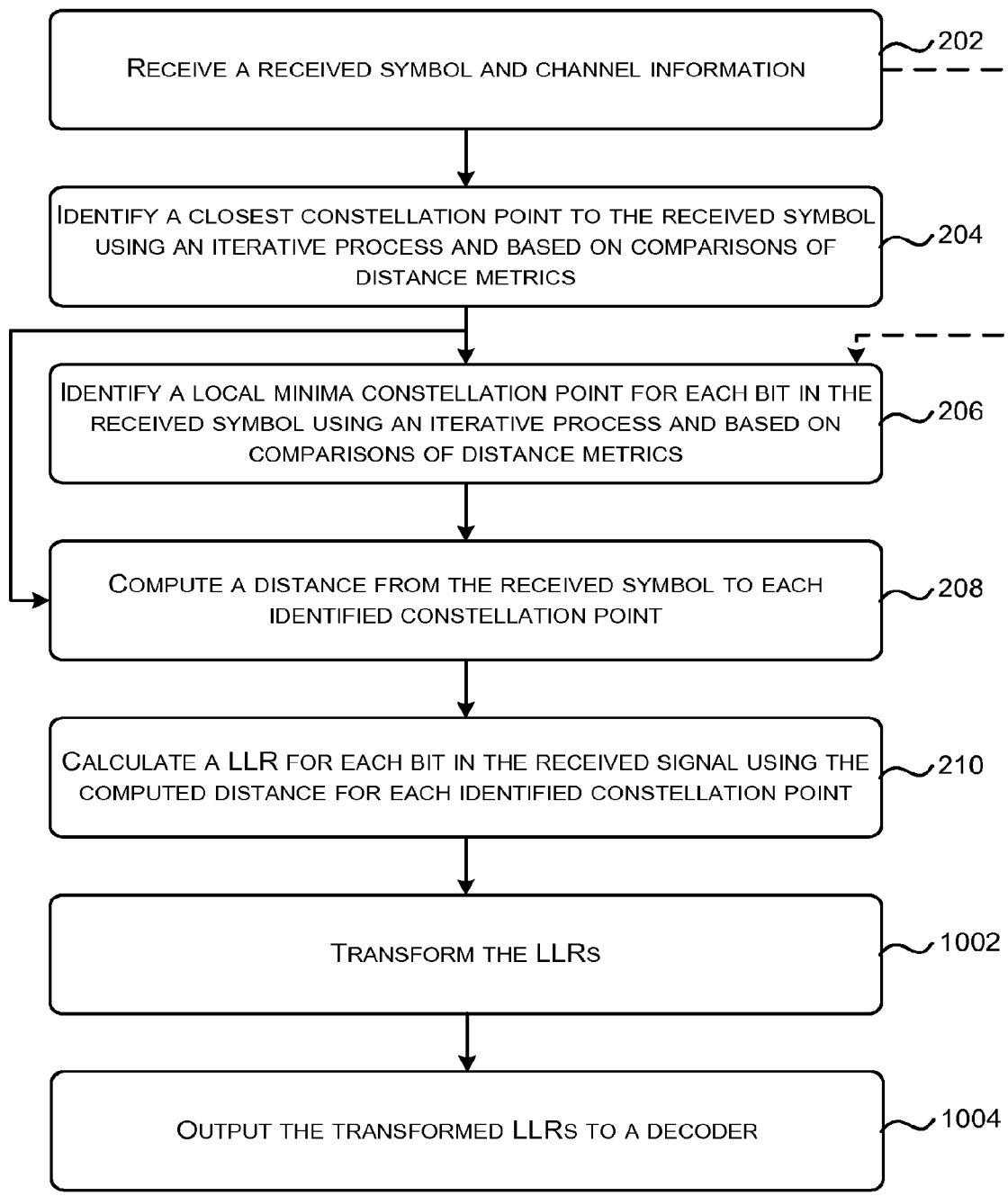
FIG. 10 shows a flow diagram of another example method of operation of a demapper in a receiver.

The methods described above use the DVB-T2 bit-to-cell mapping as the default for the demapper design, i.e. the methods described above rely on a particular Gray code mapping, which may be referred to as the internal Gray code mapping. Where a different bit-to-cell mapping is used, the method may be modified such that the LLRs are transformed (block 1002) before they are output to the decoder (block 1004), as shown in FIG. 10. This transformation process (in block 1002) specifies the multiplexing order of the LLRs passed to and from the demapper. In an example, the transformation may be implemented using two operations: LLR select and LLR invert and these can be described with reference to the following table showing two different Gray codes for 16-QAM.

| Constellation Point | DVB-T2 Gray Coding | Example Gray Coding |
|---|---|---|
| 0 | 0000 | 1000 |
| 1 | 0001 | 1010 |
| 2 | 0010 | 1001 |
| 3 | 0011 | 1011 |
| 4 | 0100 | 0000 |
| 5 | 0101 | 0010 |
| 6 | 0110 | 0001 |
| 7 | 0111 | 0011 |
| 8 | 1000 | 1100 |
| 9 | 1001 | 1110 |
| 10 | 1010 | 1101 |
| 11 | 1011 | 1111 |
| 12 | 1100 | 0100 |
| 13 | 1101 | 0110 |
| 14 | 1110 | 0101 |
| 15 | 1111 | 0111 |

In this table, the second column shows the DVB-T2 Gray mapping that is used internally within the demapper. The third column lists a different Gray mapping. In this example, to use the methods described above, LLR_SELECT has the values [1 0 3 2] and LLR_INVERT has the values [1 0 0 0]. This means that bit 0 in the new mapping is mapped internally to bit 1 ([1 0 3 2]) and is inverted ([1 0 0 0]), bit 1 in the new mapping is mapped internally to bit 0 with no inversion of the sign, bit 2 is mapped to bit 3 with no inversion and bit 3 is mapped to bit 2 with no inversion. Taking row 10 of the table as an example, the DVB-T2 mapping is 1010. If LLR_SELECT is applied to 1010, the output is 0101 and then when LLR_INVERT is applied this results in 1101.

The LLR_SELECT and LLR_INVERT functions (in block 1002) may be implemented by passing the LLR output (from block 210) through a multiplexer and selective inverter to output the right bit order to the external mapping. Note when iterative demapping is used, the input LLRs must also be transformed back to the internal gray mapping using the inverse of the mapping specified by LLR_SELECT and LLR_INVERT.

Figure 11:
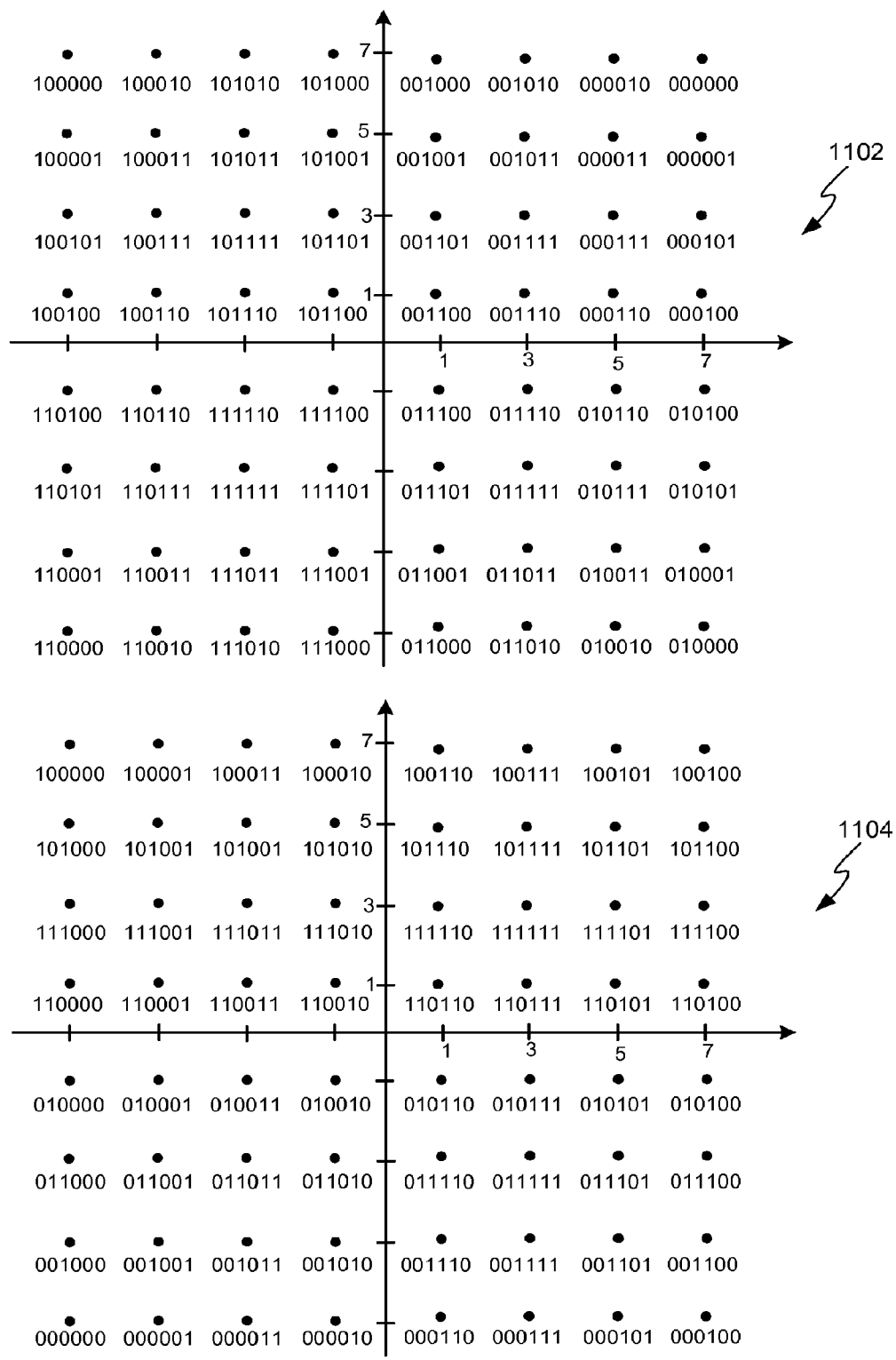
FIG. 11 shows schematic diagrams of an operation applied to transform an input Gray code mapping to an internal Gray code mapping which is used in the methods described herein.

An example method of configuring both LLR_SELECT and LLR_INVERT may be described with reference to FIG. 11. FIG. 11 shows two 64-QAM constellations 1102, 1104. The first constellation 1102 is the default constellation used in the demapper for 64-QAM (the DVB-T2 constellation) where the bit order is (y0, y1, y2, y3, y4, y5). The second constellation 1104 is the 64-QAM constellation used in GB20600, which is a Digital Terrestrial Television standard used in China. In GB20600 the bit order is (b5, b4, b3, b2, b1, b0) and the symmetry property is not the same as in the default constellation 1102.

The LLR_SELECT mapping may be configured based on the symmetry of the two constellations (i.e. the default constellation 1102 and the actual constellation, which in this example is constellation 1104). By examining the default constellation 1102 it can be determined that bits (y1, y3, y5) flip from 0 to 1 using symmetry along the x-axis while bits (y0, y2, y4) flip from 0 to 1 using symmetry along the y-axis.

For example, for bit 'y5' the symbol with bit sequence '000000' becomes '000001' by symmetry along a line parallel to the x-axis drawn at y=6. Similarly, for bit 'y3' the symbol with bit sequence '000000' becomes '000100' by symmetry along a line parallel to the x-axis drawn at y=4. Also, for bit 'y1' the symbol with bit sequence '000000' becomes '010000' by symmetry along a line parallel to the x-axis drawn at y=0. Considering the remaining three bits, for bit 'y4' the symbol with bit sequence '000000' becomes '000010' by symmetry along a line parallel to the y-axis drawn at x=6. Similarly, for bit 'y2' the symbol with bit sequence '000000' becomes '001000' by symmetry along a line parallel to the y-axis drawn at x=4. Also, for bit 'y0' the symbol with bit sequence '000000' becomes '100000' by symmetry along a line parallel to the y-axis drawn at x=0. This can be extended to all symbols.

Looking at the other constellation, the bit sequence '000000' becomes '001000' by symmetry along a line parallel to the x-axis drawn at y=−6. This means that bit y5 in the default mapping is mapped to bit b3 in the GB20600 constellation.

The bit sequence '000000' becomes '010000' by symmetry along a line parallel to the x-axis drawn at y=−4. This means that bit y3 in the default mapping is mapped to bit b4 in the GB20600 constellation.

Also, bit sequence '000000' becomes '100000' by symmetry along a line parallel to the x-axis drawn at y=0. This means that bit y1 in the default mapping is mapped to bit b5 in the GB20600 constellation.

The bit sequence '000000' becomes '000001' by symmetry along a line parallel to the y-axis drawn at x=−6. This means that bit y4 in the default mapping is mapped to bit b0 in the GB20600 constellation.

The bit sequence '000000' becomes '000010' by symmetry along a line parallel to the y-axis drawn at x=−4. This means that bit y2 in the default mapping is mapped to bit b1 in the GB20600 constellation.

The bit sequence '000000' becomes '000100' by symmetry along a line parallel to the y-axis drawn at x=0. This means that bit y0 in the default mapping is mapped to bit b2 in the GB20600 constellation.

The above analysis therefore provides the following mapping: b0->y4, b1->y2, b2->y0, b3->y5, b4->y3, b5->y1, which means that LLR_SELECT for 64-QAM in GB20600 is configured as:

LLR_SELECT_0=4

LLR_SELECT_1=2

LLR_SELECT_2=0

LLR_SELECT_3=5

LLR_SELECT_4=3

LLR_SELECT_5=1

The value of LLR_INVERT may be determined by analyzing the effect of the LLR_SELECT transformation. Considering the constellation point 000000 in the actual constellation 1102, this maps using LLR_SELECT to 000000, but should map to 110000. Consequently the bit values 0 and 1 need to be inverted, so that LLR_INVERT for 64-QAM in GB20600 is configured as:

LLR_INVERT_0=1

LLR_INVERT_1=1

LLR_INVERT_2=0

LLR_INVERT_3=0

LLR_INVERT_4=0

LLR_INVERT_5=0

By using the method shown in FIG. 10 and described above, the methods described herein may be applied to any Gray code mapping with reflective symmetries in the I/Q axes.

Figure 12:
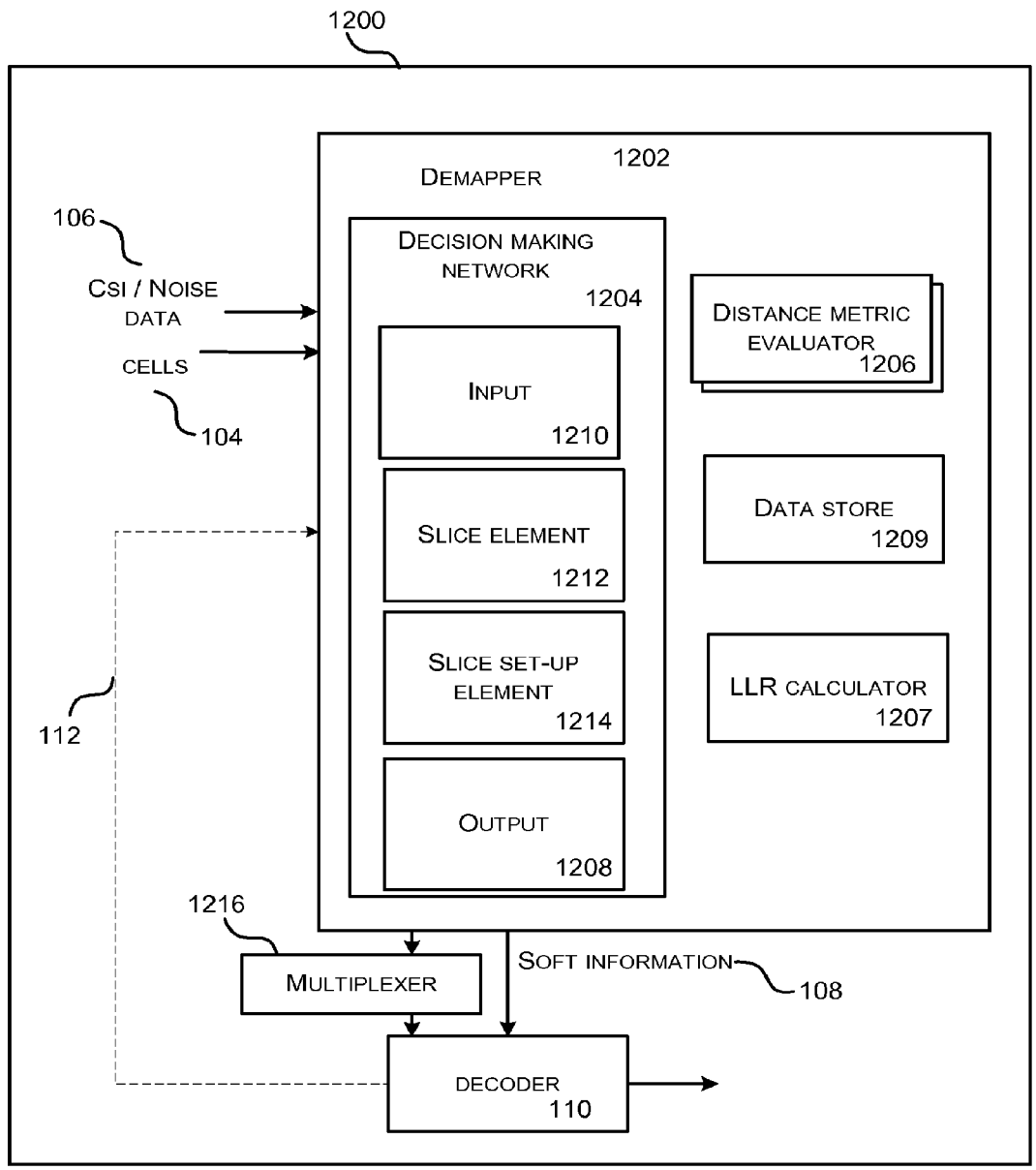
FIG. 12 is a schematic diagram of a digital communications receiver comprising a demapper arranged to perform aspects of the methods described herein.

The methods described above may be implemented within a digital communications receiver 1200, as shown in FIG. 12, and in particular within the demapper 1202 within the receiver 1200. This receiver 1200 may, for example, be an OFDM receiver, such as a DTT or DVB-T2 receiver. As described above, the first or second stage of the method may be implemented independently or both the first and second stages of the method may be implemented together. In the example shown in FIG. 12, the demapper 1202 comprises a decision making network (DMN) 1204 which identifies one or more closest constellation points using the methods described above, one or more distance metric evaluators 1206 which calculate the distances metrics to the constellation points identified by the DMN 1204 and an LLR calculating element 1207 arranged to calculate LLRs based on the calculated distance metrics. Depending on whether the first and/or second stages of the methods described above are implemented, the distance metric evaluators 1206 may calculate distance metrics to the global minimum constellation point and/or local minima constellation points determined by the DMN (where data identifying these points is provided by the DMN 1204 to the distance metric evaluators 1206 via the DMN's output 1208). The demapper 1202 may further comprise a data store 1209 which may be used to store distance metrics and other parameters determined by or used by the demapper.

In addition to comprising an output 1208, the DMN 1204 further comprises an input 1210, a slice element 1212 and a slice set-up element 1214. The input 1210 is arranged to receive the data which is required to perform the methods described above, such as channel state information or noise data (e.g. noise standard deviations) 106 and the received symbol z. The slice element 1212 comprises an instance of hardware logic which is arranged to execute the slicing operation (in the first and/or second stage of the method) and the slice set-up element 1214 is arranged to set-up or re-setup variables that are required to perform slicing operations (as described above).

Where the LLRs (or other soft information) are transformed prior to outputting them to the decoder, as described above with reference to FIGS. 10 and 11, the digital communications receiver 1200, or the demapper 1202 within the digital communications receiver 1200, may further comprise a multiplexer and selective inverter 1216. As described above, the soft information generated by the demapper 1202 may be passed through the multiplexer 1216 in order that the soft information is output in the right bit order.

The demapper 1202 and any functional blocks within the demapper (e.g. distance metric evaluators 1206 and the DMN 1204) may be implemented in hardware and/or software and in an example, the entire receiver 1200 may be implemented as a single silicon chip. In an example, the demapper 1202 comprises one or more processors which may be microprocessors, controllers or any other suitable type of processors for processing computer executable instructions to control the operation of the device in order to perform some or all of the steps of the methods described herein. In some examples, for example where a system on a chip architecture is used, the processors may include one or more fixed function blocks (also referred to as accelerators) which implement some or all of the methods described above (e.g. the distance metric evaluation and/or the slice operation) in hardware (rather than software or firmware).

The computer executable instructions (which when executed cause the processor to implement one or more steps from the methods described herein) may be provided using any computer-readable media that is accessible by the processor. Computer-readable media may include, for example, computer storage media such as memory and communications media. Computer storage media, such as memory, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. It will be appreciated that the computer storage media (or memory) may be within the receiver 1200 or alternatively the storage may be distributed or located remotely and accessed via a network or other communication link (e.g. using a communication interface).

The memory described above which stores the computer executable instructions, or another memory element, provides the data store 1209 for the demapper 1202 and as described above, this data store 1209 may be internal to or external to the demapper.

It will be appreciated that FIG. 12 only shows a subset of the elements within a receiver and the receiver may comprise many other elements. Similarly, only a subset of the elements within the demapper are shown for the sake of clarity. It will also be appreciated that the elements in FIG. 12 are functional elements and in different implementations, some of the functional elements may be combined together within a physical device.

Although the methods described above may use DVB or DVB-T2 constellations, this is by way of example and the methods may be applied more broadly than to demapping DVB or DVB-T2 signals. As described above with reference to FIGS. 10 and 11, a transformation step may be used to transform any Gray code mapping to the internal Gray code mapping (which in this example corresponds to the DVB-T2 mapping) which is used by the methods described herein. In other examples, different Gray code mappings may be used as the internal Gray code mapping and the equations described above may be modified accordingly.

Although particular constellations are used by way of example only in the description above, the methods may be applied more broadly to other constellations and the methods are not limited to OFDM signals. For example, the methods may be applied to other systems using digital modulation schemes including, but not limited to, BPSK, QPSK, and M-QAM, where $M=2^L$ and L is an integer, including rotated variants. The methods are also applicable to Q-delayed constellations (e.g. as used in DVB-T2) and also to any re-ordering that transmits the I and Q components on different channels (e.g. on different sub-carriers).

The term 'processor' and 'computer' are used herein to refer to any device with processing capability such that it can execute instructions. Those skilled in the art will realize that such processing capabilities are incorporated into many different devices and therefore the term 'computer' includes set top boxes, media players, digital radios, PCs, servers, mobile telephones, personal digital assistants and many other devices.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term 'comprising' is used herein to mean including the method blocks or elements identified, but that such blocks or elements do not comprise an exclusive list and an apparatus may contain additional blocks or elements and a method may contain additional operations or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A demapper for use in a digital communications receiver, the demapper comprising:
    an input arranged to receive a received symbol;
    a decision making network arranged to identify a local minimum constellation point for each bit in the received symbol using an iterative slicing process and based on calculations of signs of differences between distance metrics running parallel to a row or column of constellation points;
    a distance metric evaluator arranged to compute a minimum distance metric from the received symbol to each local minimum constellation point; and
    a soft information calculating element arranged to calculate soft information for each bit in the received symbol using the computed minimum distance metric from the received symbol to each local minimum constellation point; and
    an output arranged to output the soft information for use by a decoder within the receiver.

2. A demapper as set forth in claim 1, wherein the decision making network is arranged to identify a local minimum constellation point for an even bit in the received symbol using an iterative slicing process that is arranged to:
    locate a first minimum distance metric point along a column within a constellation using an iterative slicing process and based on calculations of sign of differences between distance metrics to identify a row; and
    locate a second minimum distance metric point along half of the identified row using an iterative slicing process and based on calculations of signs of differences between distance metrics,
    wherein the distance metrics used in locating said first minimum distance metric point along a column run parallel to the column and the distance metrics used in locating said second minimum distance metric point along a half of the identified row run parallel to the row.

3. A demapper as set forth in claim 2, wherein an iterative slicing process for locating a third minimum distance metric point along a half of a full column is arranged to:
    determine a sign of a difference between distance metrics to identify a half of a search space in which the received cell is located, the distance metrics comprising one dimensional distance metrics between the received symbol and constellation points located either side of a line dividing the search space in half and wherein the one dimensional distance metrics are measured parallel to the column; and
    repeat the step of determining a sign of a difference between distance metrics to identify a half of the search space in which the received cell is located until the half of the search space identifies a row;
    wherein for a first iteration the search space comprises the half or the full column and for each subsequent iteration, the search space comprises the half of the search space in which the received cell is located as identified in the previous iteration.

4. A demapper as set forth in claim 3, wherein the sign of the difference between distance metrics is determined, when locating any minimum distance metric point along at least part of a column, without evaluating the distance metrics by using imaginary parts of the constellation points located either side of the line dividing the search space in half and a quadrature-phase component of the received symbol.

5. A demapper as set forth in claim 2, wherein an iterative slicing process for locating any minimum distance metric point along a half or a full row is arranged to:
    determine a sign of a difference between distance metrics to identify a half of a search space in which the received cell is located, the two distance metrics comprising one dimensional distance metrics between the received symbol and constellation points located either side of a line dividing the search space in half and where the one dimensional distance metrics are parallel to the row; and
    repeat the step of determining a sign of a difference between difference metrics to identify a half of the search space in which the received cell is located until the half of the search space identifies a column;
    wherein for a first iteration the search space comprises the half or the full row and for each subsequent iteration, the search space comprises the half of the search space in which the received cell is located as identified in the previous iteration.

6. A demapper as set forth in claim 1, wherein the decision making network is arranged to identify a local minimum constellation point for an odd bit in the received symbol using an iterative slicing process that is arranged to:
    locate a first minimum distance metric point along a half of a column within a constellation using an iterative slicing process and based on calculations of signs of differences between distance metrics to identify a row; and locate a second minimum distance metric point along the identified row using an iterative slicing process and based on calculations of signs of differences between distance metrics;

wherein the distance metrics used in locating said first minimum distance metric point along a half of a column run parallel to the column and the distance metrics used in locating said second minimum distance along an identified row run parallel to the row.

7. A demapper as set forth in claim 1, wherein the decision making network is further arranged to determine, based on the received channel information, whether a noise metric associated with an in-phase component exceeds a noise metric associated with a quadrature component; and in response to a determination that the noise metric associated with an in-phase component does not exceed the noise metric associated with a quadrature component, the decision making network is arranged to identify a local minimum constellation point for an even bit in the received symbol using an iterative slicing process that is arranged to:

locate a first minimum distance metric point along half a row within a constellation using an iterative slicing process and based on calculations of signs of differences between distance metrics to identify a column; and locate a second minimum distance metric point along the identified column using an iterative slicing process and based on calculations of signs of differences between distance metrics; and identify a local minimum constellation point for an odd bit in the received symbol using an iterative slicing process that is arranged to:

locate a third minimum distance metric point along a row within a constellation using an iterative slicing process and based on calculations of signs of differences between distance metrics to identify a column; and locate a fourth minimum distance metric point along half of the identified column using an iterative slicing process and based on calculations of signs of differences between distance metrics, wherein the distance metrics used in locating said second or fourth minimum distance metric point along all or part of a column run parallel to the column and the distance metrics used in locating said first or third minimum distance metric point along all or part of a row run parallel to the row.

8. A demapper as set forth in claim 1, wherein the receiver is arranged to use rotated constellations and the decision making network is further arranged to unrotate the received symbol prior to identifying any constellation points.

9. A method of demapping received symbols in a digital communications receiver, the method comprising:

receiving, at an input, a received symbol;

identifying, for each bit in the received symbol, a local minimum constellation point using an iterative slicing process and based on calculations of signs of differences between distance metrics running parallel to a row or column of constellation points;

computing a minimum distance metric from the received symbol to each local minimum constellation point;

calculating soft information for each bit in the received symbol using the computed minimum distance metric from the received symbol to each local minimum constellation point; and outputting the soft information for use by a decoder within the receiver.

10. A method as set forth in claim 9, wherein identifying a local minimum constellation point for an even bit in the received symbol using an iterative slicing process comprises:

locating a minimum distance metric point along a column within a constellation using an iterative slicing process and based on calculations of signs of differences between distance metrics to identify a row; and locating a minimum distance metric point along half of the identified row using an iterative slicing process based on calculations of signs of differences between distance metrics, wherein the distance metrics used in locating any minimum distance metric point along a column run parallel to the column and the distance metrics used in locating a minimum distance metric point along a half of the identified row run parallel to the row.

11. A method as set forth in claim 10, wherein the iterative slicing process for locating any minimum distance metric point along a half or a full column comprises:

determining a sign of a difference between distance metrics to identify a half of a search space in which the received cell is located, the distance metrics comprising one dimensional distance metrics between the received symbol and constellation points located either side of a line dividing the search space in half and wherein the one dimensional distance metrics are measured parallel to the column; and repeating the step of determining a sign of a differences between distance metric to identify a half of the search space in which the received cell is located until the half of the search space identifies a row, wherein for a first iteration the search space comprises the half or the full column and for each subsequent iteration, the search space comprises the half of the search space in which the received cell is located as identified in the previous iteration.

12. A method as set forth in claim 11, wherein the sign of the difference between distance metrics is determined, when locating any minimum distance metric point along at least part of a column, without evaluating the distance metrics by using imaginary parts of the constellation points located either side of the line dividing the search space in half and a quadrature-phase component of the received symbol.

13. A method as set forth in claim 10, wherein the iterative slicing process for locating any minimum distance metric point along a half or a full row comprises:

determining a sign of a difference between distance metrics to identify a half of a search space in which the received cell is located, the difference between distance metrics comprising a difference between two distance metrics, the two distance metrics comprising one dimensional distance metrics between the received symbol and constellation points located either side of a line dividing the search space in half and wherein the one dimensional distance metrics are measured parallel to the row; and repeating the step of determining a sign of a difference between distance metrics to identify a half of the search space in which the received cell is located until the half of the search space identifies a column;

wherein for a first iteration the search space comprises the half or the full row and for each subsequent iteration, the search space comprises the half of the search space in which the received cell is located as identified in the previous iteration.

14. A method as set forth in claim 9, wherein identifying a local minimum constellation point for an odd bit in the received symbol using an iterative slicing process comprises:
    locating a minimum distance metric point along half of a column within a constellation using an iterative slicing process and based on calculations of signs of differences between distance metrics to identify a row; and
    locating a minimum distance metric point along the identified row using an iterative slicing process and based on calculations of signs of differences between distance metrics,
    wherein the distance metrics used in locating any minimum distance metric point along a half of a column run parallel to the column and the distance metrics used in locating any minimum distance metric point along an identified row run parallel to the row.

15. A method as set forth in claim 9, further comprising:
    determining, based on the received channel information, whether a noise metric associated with an in-phase component exceeds a noise metric associated with a quadrature component; and
    in response to determining that the noise metric associated with an in-phase component does not exceed the noise metric associated with a quadrature component, identifying a local minimum constellation point for an even bit in the received symbol using an iterative slicing process comprising:
        locating a minimum distance metric point along half a row within a constellation using an iterative slicing process and based on calculations of signs of differences between distance metrics to identify a column;
        locating a minimum distance metric point along the identified column using an iterative slicing process and based on calculations of signs of differences between distance metrics; and
    further in response to determining that the noise metric associated with an in-phase component does not exceed the noise metric associated with a quadrature component, identifying a local minimum constellation point for an odd bit in the received symbol using an iterative slicing process comprising:
        locating a minimum distance metric point along a row within a constellation using an iterative slicing process and based on calculations of signs of differences between distance metrics to identify a column; and
        locating a minimum distance metric point along half of the identified column using an iterative slicing process and based on calculations of signs of differences between distance metrics,
    wherein the distance metrics used in locating any minimum distance metric point along all or part of a column run parallel to the column and the distance metrics used in locating any minimum distance metric point along all or part of a row run parallel to the row.

16. A method as set forth in claim 9, wherein if the receiver is arranged to use rotated constellations, the received symbol is unrotated prior to identifying any constellation points.

17. A method as set forth in claim 9, wherein the steps of identifying constellation points are performed using a decision making network.

18. A non-transitory computer readable storage medium having stored thereon computer executable instructions that when executed cause at least one processor to:
    identify a local minimum constellation point for each bit in a symbol received at an input of a digital communications device using an iterative slicing process and based on signs of differences between distance metrics running parallel to a row or column of constellation points;
    compute a distance metric from the received symbol to each identified local minimum constellation point;
    calculate soft information for each bit in the received symbol using the computed distance metric from the received symbol to each local minimum constellation point; and
    output the soft information for use by a decoder within the receiver.

* * * * *